(12) United States Patent
Sunohara et al.

(10) Patent No.: US 7,727,802 B2
(45) Date of Patent: Jun. 1, 2010

(54) METHOD FOR FABRICATING AN ELECTRONIC COMPONENT EMBEDDED SUBSTRATE

(75) Inventors: Masahiro Sunohara, Nagano (JP); Keisuke Ueda, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 260 days.

(21) Appl. No.: 11/159,993

(22) Filed: Jun. 23, 2005

(65) Prior Publication Data

US 2006/0003495 A1    Jan. 5, 2006

(30) Foreign Application Priority Data

Jun. 30, 2004    (JP) .............................. 2004-194783

(51) Int. Cl.
*H01L 21/00* (2006.01)

(52) U.S. Cl. ............... 438/107; 438/124; 257/E21.502; 257/E21.503

(58) Field of Classification Search ................. 438/455, 438/456, 106–127; 174/250; 257/E27.178, 257/E21.502, E21.503; 361/764
See application file for complete search history.

(56) References Cited

U.S. PATENT DOCUMENTS

| | | | | |
|---|---|---|---|---|
| 6,103,134 | A * | 8/2000 | Dunn et al. ................... | 216/17 |
| 6,528,891 | B2 * | 3/2003 | Lin ............................. | 257/778 |
| 6,734,542 | B2 * | 5/2004 | Nakatani et al. ............ | 257/687 |
| 6,855,892 | B2 * | 2/2005 | Komatsu et al. ............ | 174/256 |
| 2003/0116843 | A1 | 6/2003 | Iijima et al. | |
| 2004/0000425 | A1 * | 1/2004 | White et al. ................ | 174/250 |
| 2004/0014317 | A1 * | 1/2004 | Sakamoto et al. ........... | 438/689 |
| 2004/0159933 | A1 * | 8/2004 | Sunohara et al. ............ | 257/700 |
| 2004/0203193 | A1 * | 10/2004 | Ooi et al. .................... | 438/118 |
| 2005/0014317 | A1 * | 1/2005 | Pyo ............................ | 438/184 |
| 2006/0014327 | A1 * | 1/2006 | Cho et al. ................... | 438/125 |
| 2006/0054352 | A1 * | 3/2006 | Ryu et al. ................... | 174/260 |

FOREIGN PATENT DOCUMENTS

| | | | |
|---|---|---|---|
| JP | 2001-053447 | * | 2/2001 |
| JP | 2001-332656 A | | 11/2001 |
| JP | 2002-016173 A | | 1/2002 |
| JP | 2002246756 | * | 8/2002 |
| JP | 2003 197809 | | 7/2003 |
| JP | 2004-056093 A | | 2/2004 |
| JP | 2004-153084 | * | 5/2004 |

OTHER PUBLICATIONS

Kenji et al. "Multilayer Circuit Board and Manufacturing Thereof" (May 27, 2004) JP Pub. 2004-153084. Machine English Translation.*

* cited by examiner

*Primary Examiner*—Khiem D Nguyen
(74) *Attorney, Agent, or Firm*—Ladas & Parry LLP

(57) ABSTRACT

A method for fabricating an electronic component embedded substrate including an electronic component that is embedded within a buildup layer is disclosed. The method includes a first buildup layer lamination step of laminating plural first buildup layers on a core substrate such that the total thickness of the first buildup layers corresponds to the thickness of the electronic component; a cavity formation step of forming a cavity for accommodating the electronic component at the laminated first buildup layers; an accommodating step of accommodating the electronic component within the cavity; and a second buildup layer lamination step of laminating a second buildup layer on the first buildup layers and the electronic component.

3 Claims, 9 Drawing Sheets

METHOD FOR FABRICATING AN ELECTRONIC COMPONENT EMBEDDED SUBSTRATE

BACKGROUND OF THE INVENTION

1. Field of the Invention

The present invention relates to a method for fabricating an electronic component embedded substrate that includes an electronic component embedded within a multilayered circuit board.

2. Description of the Related Art

In recent years and continuing, the operating frequency of semiconductor elements mounted on semiconductor devices is rising, and in turn, measures are being demanded for stabilizing the source voltage supplied to the semiconductor element. In response to such a demand, an electronic component embedded substrate has been proposed that includes an electronic component (e.g., capacitor element) that is embedded within a semiconductor device substrate on which a semiconductor element is mounted.

Also, with the high densification of the semiconductor element, the pitch at which electrode pads are formed at the semiconductor element is becoming narrower. In turn, it is becoming difficult to form a wiring pattern with a sufficiently narrow pitch, corresponding to the pitch of electrode pads formed at the semiconductor element, on a conventional printed circuit board. Therefore, use of the conventional printed circuit board as a substrate for mounting a semiconductor element is becoming less suitable.

Accordingly, in recent years and continuing, a multilayered substrate that is referred to as a buildup printed circuit board is being used that includes a printed circuit board as a core layer and buildup layers and wiring layers laminated on each side of the core layer using the buildup method where the wiring layers are interconnected by vias. In the following descriptions, a layer formed using the buildup method and having wiring formed thereon is referred to as a buildup layer.

Conventionally, in the case of embedding an electronic component (e.g., capacitor element) in such type of multilayered circuit board, an electronic component is embedded within one single buildup layer (referred to as element embedded buildup layer) of the plural buildup layers included in the multilayered circuit board as is described in Japanese Laid-Open Patent Publication No. 2003-197809, for example.

Specifically, in a process according to the buildup method, after the element embedded buildup layer is formed, a cavity is formed thereon for accommodating a chip component (electronic component), and the electronic component is embedded in this cavity. Then, a buildup layer and a wiring layer are laminated on top of the element embedded buildup layer using the buildup method, and vias are formed at the layers. Also, terminals of the electronic component provided within the element embedded buildup layer and the wiring layer of the multilayered circuit board are arranged to be electrically connected by the vias.

As is described above, in the conventional electronic component embedded substrate, an electronic component is embedded in one buildup layer (element embedded buildup layer) of the laminated buildup layers. However, in an arrangement where an electronic component is provided within the element embedded buildup layer corresponding to one single buildup layer, the thickness of the electronic component is restricted by the film thickness of the element embedded buildup layer; that is, the electronic component has to be made thinner than the element embedded buildup layer.

Normally, buildup layers that are laminated using the buildup method have a film thickness of around 50 μm, and thereby, the thickness of the electronic component can be no more than 50 μm. However, it is quite difficult to fabricate an electronic component having a thickness of 50 μm or less, and the cost of such an electronic component is quite high. Also, there are obstacles with respect to improving the production yield for fabricating such an electronic component.

SUMMARY OF THE INVENTION

The present invention has been conceived in response to one or more of the problems of the related art, and its object is to provide a method for fabricating an electronic component embedded substrate by which method an electronic component may be easily and inexpensively embedded within a substrate irrespective of the thickness of the embedded electronic component.

According to one embodiment of the present invention, a method for fabricating an electronic component embedded substrate including an electronic component that is embedded within a buildup layer is provided, the method including:

a first buildup layer lamination step of laminating plural first buildup layers on a core substrate such that the total thickness of the first buildup layers corresponds to the thickness of the electronic component;

a cavity formation step of forming a cavity for accommodating the electronic component in the laminated first buildup layers;

an accommodating step of accommodating the electronic component within the cavity; and a second buildup layer lamination step of forming a second buildup layer on the first buildup layers and the electronic component.

According to an aspect of the present invention, a first buildup layer lamination step is conducted to laminate plural buildup layers having a total thickness corresponding to the thickness of an electronic component on a core substrate, after which a cavity formation step is conducted to form a cavity for accommodating the electronic component in the laminated buildup layers. In this way, even when the thickness of one single buildup layer is less than the thickness of the electronic component, the total thickness of the plural laminated buildup layers may be arranged to correspond to the thickness of the electronic component, and the cavity may be arranged to have a sufficient depth for accommodating the electronic component.

In a preferred embodiment of the present invention, the cavity formation step includes forming the cavity through laser processing.

In another preferred embodiment, the fabrication method of the present invention includes a step of forming a stopper layer on the core substrate at a position corresponding to the formation position of the cavity, which step is conducted before the first buildup layer lamination step.

In another preferred embodiment of the present invention, a semi-additive method is used in the first buildup layer lamination step and the second buildup layer lamination step.

According to another embodiment of the present invention, a method of fabricating an electronic component embedded substrate including an electronic component that is embedded within a buildup layer is provided, the method including:

a first buildup layer lamination step including a process of forming a first buildup layer, and a process of forming an opening in the first buildup layer at a position corresponding to the formation position of a cavity for accommodating the electronic component, which processes are repetitively conducted so that plural first buildup layers having a total thickness corresponding to the thickness of the electronic component are laminated on a core substrate;

an accommodating step of accommodating the electronic component within the cavity; and a second buildup layer lamination step of laminating a second buildup layer on the first buildup layers and the electronic component.

According to an aspect of the present invention, a process of forming a buildup layer and a process of forming an opening in the formed buildup layer at a position corresponding to the formation position of a cavity are repetitively conducted so that plural buildup layers with openings formed therein are laminated so that the total thickness of the laminated buildup layers corresponds to the thickness of the electronic component. In this way, the cavity for accommodating the electronic component may be formed when the buildup layers are laminated.

In a preferred embodiment of the present invention, the process of forming the opening in the first buildup layer includes forming the opening through wet etching using a metal mask.

According to another embodiment of the present invention, a method of fabricating an electronic component embedded substrate including an electronic component that is embedded within a buildup layer is provided, the method including:

a first buildup layer lamination step of laminating plural first buildup layers on a core substrate such that the total thickness of the first buildup layers corresponds to the thickness of the electronic component, the first buildup layers having openings formed beforehand at positions corresponding to the formation position of a cavity for accommodating the electronic component;

an accommodating step of accommodating the electronic component within the cavity; and a second buildup layer lamination step of laminating a second buildup layer on the first buildup layers and the electronic component.

According to an aspect of the present invention, plural buildup layers having openings formed beforehand at positions corresponding to the formation position of a cavity are laminated such that the total thickness of the laminated buildup layers corresponds to the thickness of an electronic component, and the cavity for accommodating the electronic component is formed when the buildup layers are laminated.

In a preferred embodiment of the present invention, the core substrate includes a positioning pin, and the first buildup layers include positioning holes. The positioning pin of the core substrate is inserted through the positioning holes, and the openings of the first buildup layers are arranged to coincide with each other to form the cavity.

DETAILED DESCRIPTION OF THE PREFERRED EMBODIMENTS

In the following, preferred embodiments of the present invention are described with reference to the accompanying drawings.

Figure 7:
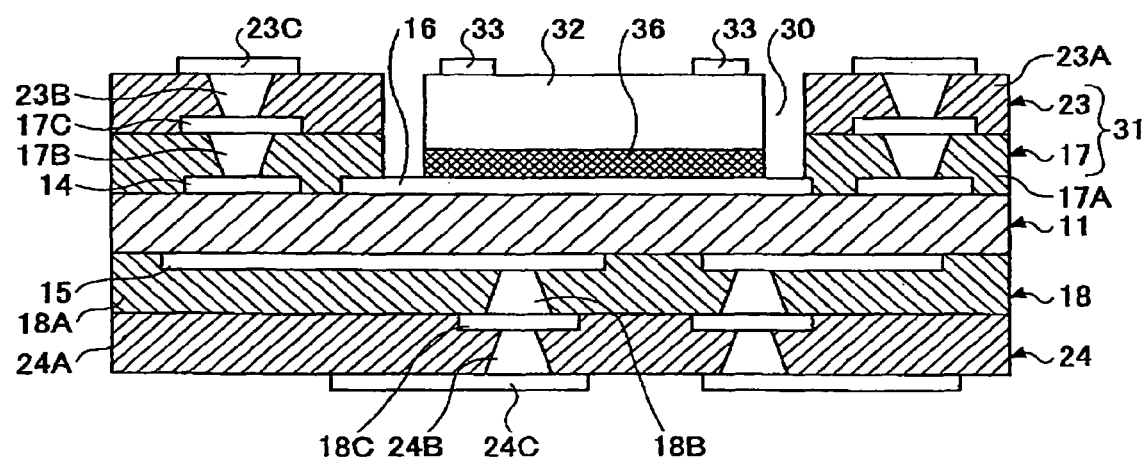
FIG. 7 is a diagram illustrating a seventh step of the fabrication method according to the first embodiment.
Figure 8:
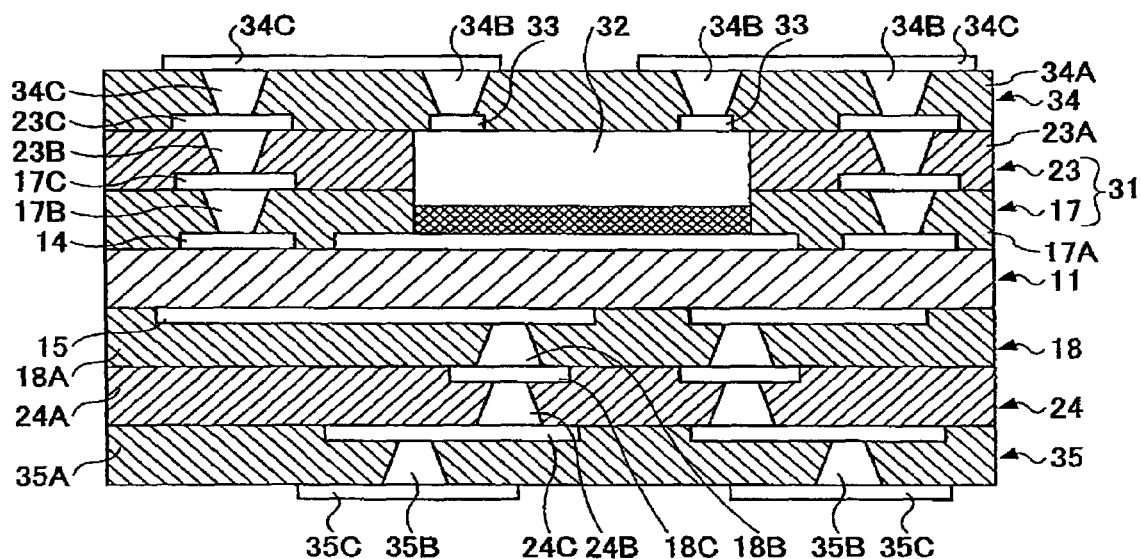
FIG. 8 is a diagram illustrating eighth step of the fabrication method according to the first embodiment.
Figure 9:
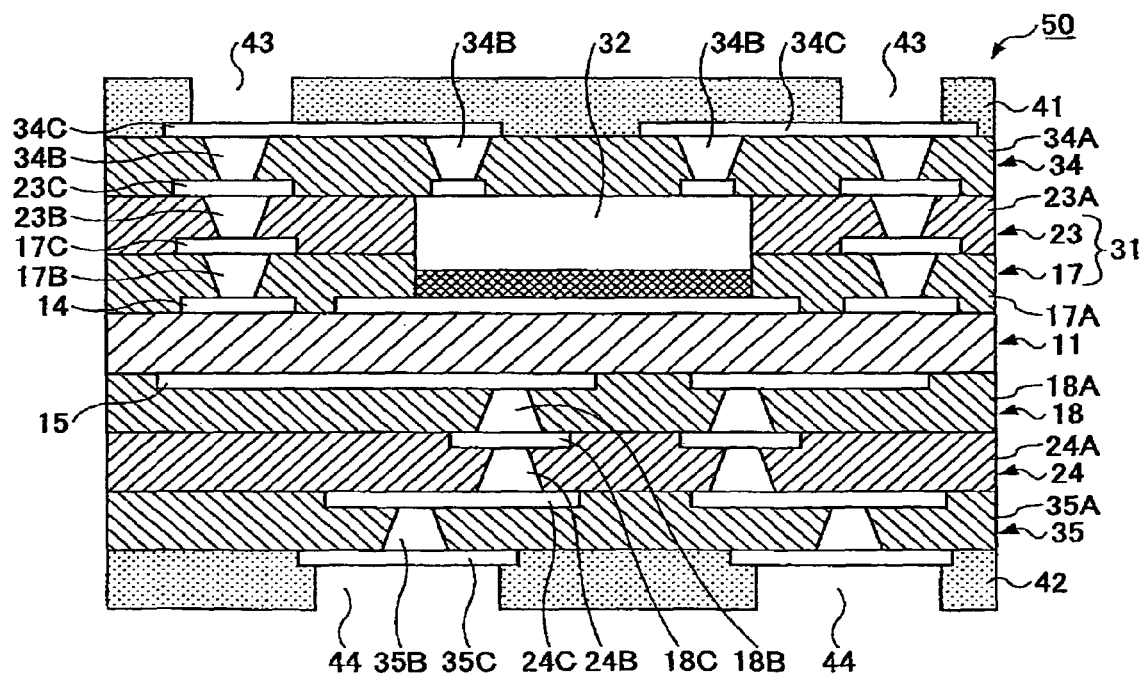
FIG. 9 is a diagram illustrating a ninth step of the fabrication method according to the first embodiment.
Figure 10:
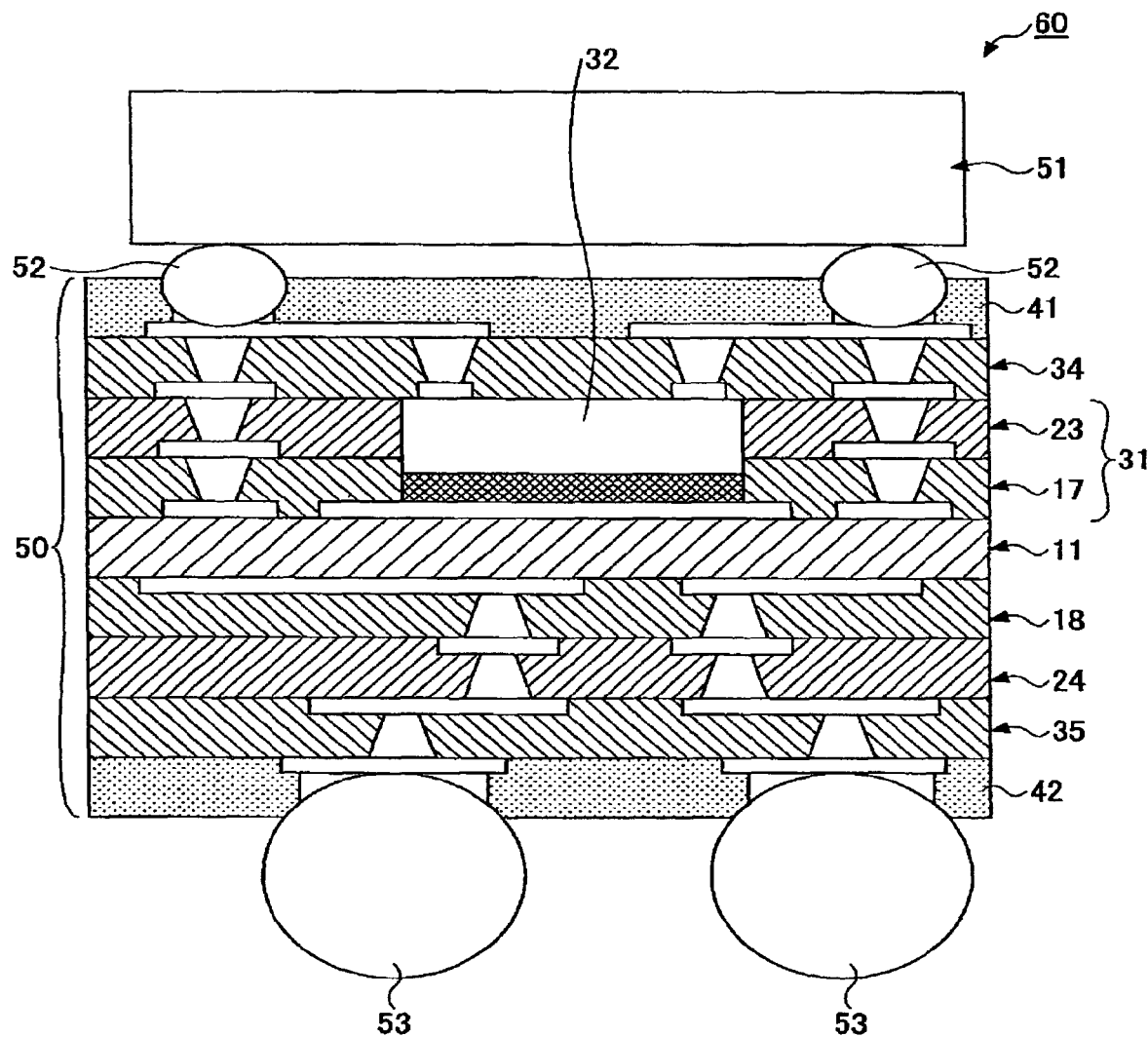
FIG. 10 is a diagram illustrating a semiconductor device that implements the electronic component embedded substrate fabricated using the fabrication method of the first embodiment.

FIGS. 1~10 are diagrams illustrating process steps of a method of fabricating an electronic component embedded substrate according to a first embodiment of the present invention. Particularly, FIG. 9 is a diagram illustrating an electronic component embedded substrate 50 that is fabricated according to the fabrication method of the present embodiment, and FIG. 10 is a diagram illustrating a semiconductor device 60 that implements the electronic component embedded substrate 50. In the following, configurations of the electronic component embedded substrate 50 and the semiconductor device 60 that are fabricated according to the fabrication method of the present embodiment are described.

As is shown in FIG. 9, the electronic component embedded substrate 50 includes a core substrate 11, buildup layers 17, 18, 23, 24, 34, 35, an embedded electronic component 32, and solder resists 41 and 42, for example. The core substrate 11 may be formed by processing a double-sided copper clad laminate in a manner described below, and wirings 14 and 15 are respectively formed on the upper and lower surfaces of the core substrate 11.

On the upper side of the core substrate 11, the buildup layers 17, 23, and 34 are laminated in this order. On the lower side of the core substrate 11, buildup layers 18, 24, and 35 are laminated in this order. The buildup layers 17, 18, 23, 24, 34, and 35 include insulating layers 17A, 18A, 23A, 24A, 34A, 35A, vias 17B, 18B, 23B, 24B, 34B, 35B, and wiring layers 17C, 18C, 23C, 24C, 34C, 35C, respectively. It is noted that the wiring layers 17C, 18C, 23C, 24C, 34C, and 35C are interconnected by the vias 17B, 18B, 23B, 24B, 34B, and 35B.

The electronic component embedded substrate 50 shown in FIG. 9 includes the embedded electronic component 32 on the upper side of core substrate 11. It is noted that the embedded electronic component 32 corresponds to a chip capacitor in the illustrated embodiment; however, the present invention is not limited to embedding a chip capacitor. The embedded electronic component 32 is connected to the wiring layer 34C by the vias 34B.

The solder resist 41 is formed on the surface of the uppermost buildup layer 34, and the solder resist 42 is formed on the surface of the lowermost buildup layer 35. Openings 43 are formed at the solder resist 41 which openings 43 realize connection between bumps 52 provided on a semiconductor chip 51 (see FIG. 10) and the wiring layer 34C. Also, openings 44 are formed at the solder resist 42, and solder balls 53 (see FIG. 10) corresponding to external terminals are connected to the openings 44.

In the following, the embedded state of the electronic component 32 accommodated within the buildup layers 17, 23, and 34 that are laminated on the core substrate 11 is described. In the illustrated embodiment, the embedded electronic component 32 is thicker than each of the individual buildup layers 17, 23, and 34. Specifically, the thickness of the embedded electronic component 32 is arranged to be around 100 μm, and the thickness of each of the buildup layers 17, 23, and 34 is arranged to be around 50 μm.

The embedded electronic component 32 is accommodated within a laminated structure made up of the buildup layer 17 and the buildup layer 23 (referred to as 'first buildup layer laminated structure 31' hereinafter). It is noted that the upper surface of the embedded electronic component 32 forms a substantially common plane with the upper surface of the buildup layer 23.

By embedding an electronic component 32 within the first buildup layer laminated structure 31 made up of plural buildup layers (e.g., buildup layers 17 and 23), the cost of the electronic component embedded substrate 50 and the semiconductor device 60 implementing the electronic component embedded substrate 50 may be reduced and their production yields may be improved as is described below.

In the following, a method for fabricating the electronic component embedded substrate 50 having the above configuration is described.

Figure 1:
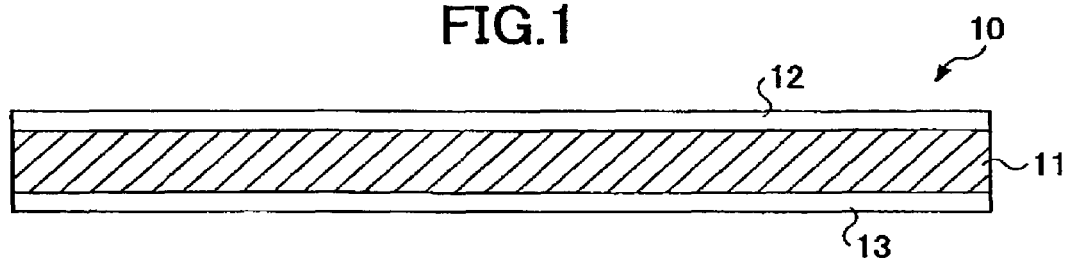
FIG. 1 is a diagram illustrating a first step of a method for fabricating an electronic component embedded substrate according to a first embodiment of the present invention.

In fabricating the electronic component embedded substrate 50, first, as is shown in FIG. 1, a copper clad laminate 10 is provided. The copper clad laminate 10 includes the core substrate 11 and copper films 12 and 13 that are formed on the upper and lower surfaces of the core substrate 11, respectively.

Figure 2:
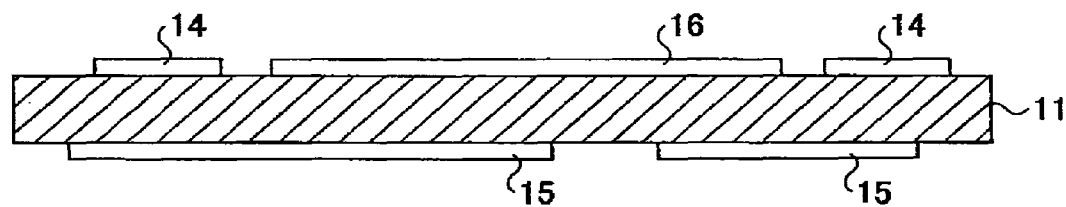
FIG. 2 is a diagram illustrating a second step of the fabrication method according to the first embodiment.

A photo resist is applied to the surfaces of the copper clad laminate 10, after which exposure/development processes are successively conducted to remove the resist from portions other than the portions corresponding to predetermined positions at which the wirings 14, 15, and a stopper layer 16 are to be formed. Then, the patterned resist is used as a mask to conduct etching on the copper films 12 and 13. Then, the resist is removed from the surfaces of the core substrate 11, and in this way, the wirings 14, 15, and the stopper layer 16 are formed on the surfaces of the core substrate 11 as is shown in FIG. 2.

After the wirings 14, 15, and the stopper layer 16 are formed on the surfaces of the core substrate 11 in the manner described above, the buildup layers 17, 18, 23, 24, 34, and 35 are alternately formed on the upper and lower surfaces of the core substrate 11, respectively. It is noted that the buildup layers 17, 18, 23, 24, 34, and 35 are formed using the buildup method. Specifically, in the illustrated embodiment, the semi-additive method is used as the buildup method. In the following, specific process steps for forming the buildup layers 17, 18, 23, 24, 34, and 35 are described.

Figure 3:
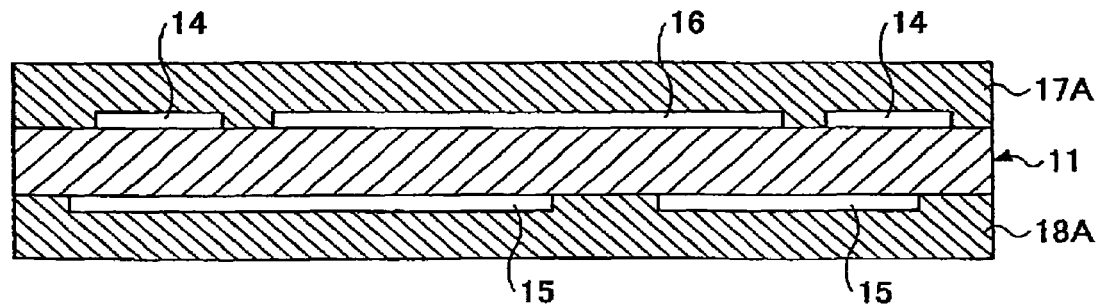
FIG. 3 is a diagram illustrating a third step of the fabrication method according to the first embodiment.

To form the buildup layers 17 and 18, first, insulating layers 17A and 18A are respectively formed on the upper and lower surfaces of the core substrate 11 as is shown in FIG. 3. Specifically, buildup insulating resin films (simply referred to as 'buildup film' hereinafter) are arranged on the surfaces of the core substrate 11 after which a hardening process is performed on the buildup films. In this way, the insulating layers 17A and 18A are formed.

Figure 4:
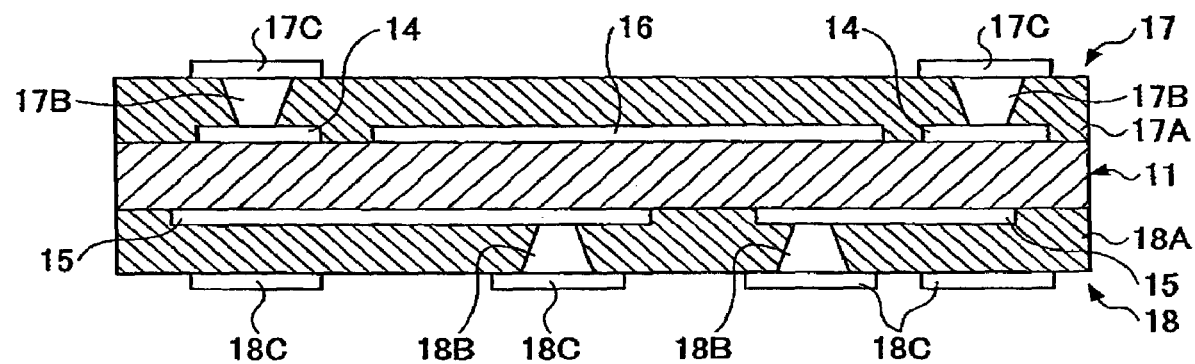
FIG. 4 is a diagram illustrating a fourth step of the fabrication method according to the first embodiment.

After the insulating layers 17A and 18A are formed, vias 17B, 18B and wiring layers 17C, 18C are respectively formed on the insulating films 17A and 18A through conventional methods. Specifically, via holes are formed by applying a laser onto portions of the insulating layers 17A and 18A corresponding to formation positions of the vias 17B and 18B after which seed layers are formed on the surfaces of the insulating layers 17A and 18A through a non-electroplating process. Then, an electro copper plating process is performed using the seed layers as power supplying electrodes to form copper layers on the surfaces of the insulating films 17A and 18A. Then, a patterning process similar to that conducted for forming the wirings 14, 15 and the stopper layer 16 as is described above is performed on the copper films, and in this way, the vias 17B, 18B, and the wiring layers 17C, 18C are formed. FIG. 4 is a diagram showing a state in which the buildup layers 17 and 18 are formed on the surfaces of the core substrate 11.

Figure 5:
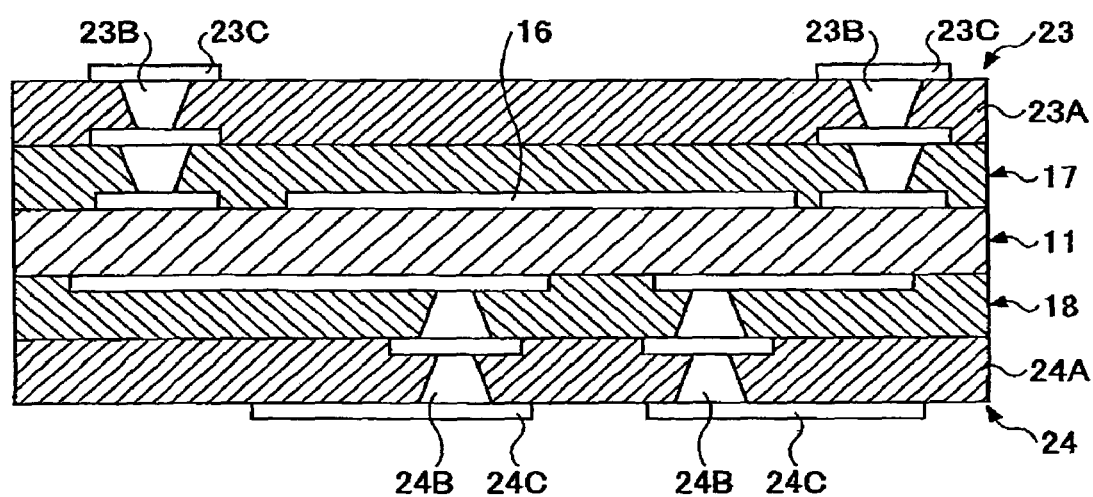
FIG. 5 is a diagram illustrating a fifth step of the fabrication method according to the first embodiment.

After the buildup layers 17 and 18 are formed in the manner described above, the buildup layers 23 and 24 are formed. It is noted that the process steps for forming the buildup layers 23 and 24 are identical to the processes steps for forming the buildup layers 17 and 18 described above (the same process steps are also used for forming the buildup layers 34 and 35 as is described below), and thereby, their descriptions are omitted. FIG. 5 is a diagram showing a state in which the buildup layers 23 and 24 having vias 23B, 24B and wiring layers 23C, 24C, respectively, are formed on the core substrate 11.

Figure 6:
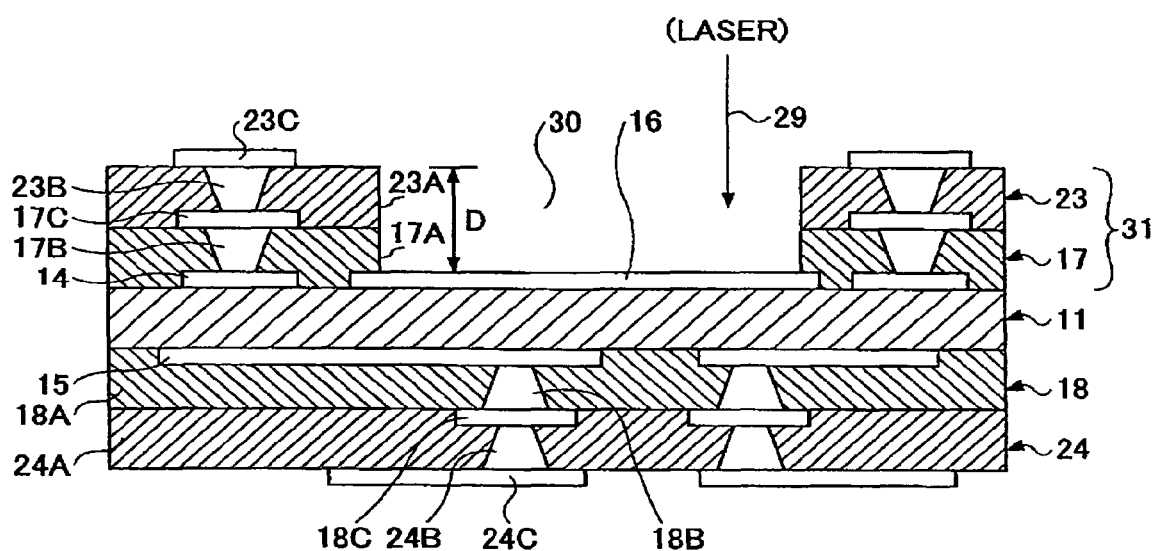
FIG. 6 is a diagram illustrating a sixth step of the fabrication method according to the first embodiment.

After the buildup layers 23 and 24 are formed, a cavity 30 is formed at the buildup layers 17 and 23 on the upper side of the core substrate 11. In the illustrated embodiment, a laser processing method is used as a method of forming the cavity 30. Specifically, as is shown in FIG. 6, laser 29 is irradiated from the upper direction to form the cavity 30. As is described below, the embedded electronic component 32 is accommodated within the cavity 30.

As is described above, according to the illustrated embodiment, the laser processing method is used to form the cavity 30. In this way, the cavity 30 may be formed with relatively simple processing equipment using relatively few process steps compared to the case of using a method involving a removal process such as etching, for example.

It is generally known that controlling the depth of a cavity formed through laser processing is difficult. Accordingly, in the present embodiment, the stopper layer 16 is formed on a portion of the core substrate 11 corresponding to the position at which the cavity 30 is to be formed. It is noted that the processing speed of the laser 29 for processing the stopper layer 16 made of copper is slower compared to that for processing the insulating layers 17A and 18A made of resin.

Thus, using the difference in the processing speeds, the irradiating position of the laser 29 may be moved when the insulating layer 17A and 23A are removed and the stopper layer 16 is exposed, and the irradiation of the laser 29 may be stopped after processing of the cavity 30 is completed. In this way, the cavity 30 with a uniform depth D may be easily formed.

It is noted that the method of forming the cavity 30 is not limited to use of the laser processing method, and other methods such as router processing, dry etching, desmear processing, and combinations thereof (including laser processing) may be used to form the cavity 30 as well.

By forming the cavity 30 in the manner described above, openings are formed at the buildup layers 17 and 23, respectively. The laminated structure including the buildup layers 17 and 23 having the openings formed thereon is referred to as first buildup layer laminated structure 31 hereinafter. It is noted that the depth D of the cavity 30 may be easily adjusted by adaptively changing the thickness of the insulating layers 17A and 23A as necessary or desired.

After the cavity 30 is formed, the electronic component 32 is accommodated within the cavity 30 as is shown in FIG. 7. Specifically, adhesive 36 is applied to the bottom surface of the electronic component 32, and the electronic component 32 is fixed on top of the stopper layer 16 by the adhesive 36. It is noted that the upper surface of the electronic component 32 is arranged to form a substantially common plane with the upper surface of the buildup layer 23 when the electronic component 32 is accommodated within the cavity 30. Also, the upper surfaces of electrodes 33 formed on the embedded electronic component 32 and the upper surface of the wiring layer 23C formed on the buildup layer 23 also form a substantially common plane.

As is described above, the depth D of the cavity 30 may be adjusted by adaptively changing the thickness of the insulating layers 17A and 23A as necessary or desired upon forming the buildup layers 17 and 23. Therefore, the thickness of the embedded electronic component 32 (i.e., a thickness including the thickness of the adhesive 36 to be more precise) and the depth D of the cavity 30 may easily be arranged to correspond; that is, the upper surface of the embedded electronic component 32 and the upper surface of the buildup layer 23 may easily be arranged to form a substantially common plane.

According to the present embodiment, the embedded electronic component 32 is accommodated within the cavity 30 formed at the first buildup layer laminated structure 31 made up of plural buildup layers (e.g., buildup layers 17 and 23). That is, instead of being embedded within one single buildup layer as in the conventional art, in the present embodiment, the electronic component 32 is embedded within plural buildup layers (e.g., buildup layers 17 and 23).

By laminating plural buildup layers (e.g., buildup layers 17 and 23) on the core substrate 11 to form the first buildup laminated structure 31 that has a thickness corresponding to the thickness of the embedded electronic component 32, and forming the cavity 30 at the first buildup laminated structure 31 for accommodating the electronic component 32, even when the thickness of each of the individual buildup layers (e.g., approximately 50 µm) is less than the thickness of the embedded electronic component 32 (e.g., approximately 100 µm), the first buildup laminated structure 31 may be arranged to have a thickness corresponding to the thickness of the embedded electronic component 32. In this way, the cavity 30 may be arranged to have a sufficient depth D for suitably accommodating the embedded electronic component 32.

As can be appreciated from the above descriptions, the thickness of the embedded electronic component 32 is not constrained to be less than or equal to the thickness of the buildup layers 17/23. In this way, cost increase of the embedded electronic component 32 may be avoided, and its production yield may be improved. In turn, the cost of the electronic component embedded substrate 50 implementing the embedded electronic component 32 may be reduced and its production yield may be improved.

Also, according to the present embodiment, the cavity 30 is formed after plural buildup layers (e.g., buildup layers 17 and 23) having a total thickness corresponding to the thickness of the embedded electronic component 32 are formed (laminated). In this way, the cavity 30 may be more accurately formed compared to a case of separately forming an opening at each of the buildup layers and laminating the buildup layers thereafter to form a cavity.

After the electronic component 32 is accommodated within the cavity 30 in the manner described above, the buildup layer 34 is formed on the upper surfaces of the first buildup layer laminated structure 31 (i.e., buildup layers 17 and 23) with the cavity 30 and the embedded electronic component 32 as is shown in FIG. 8. Also, the buildup layer 35 is formed on the lower surface of the buildup layer 24. The buildup layer 34 includes an insulating film 34A, vias 34B, and a wiring layer 34C. The buildup layer 35 includes an insulating layer 35A, vias 35B, and a wiring layer 35C.

It is noted that in the illustrated embodiment, a single buildup layer 34/35 is formed on each of the buildup layers 23 and 24. However, the present invention is not limited to laminating one single buildup layer on each of the buildup layers 23 and 24, and plural layers may be formed on the buildup layers 23 and 24 as well.

Also, as is shown in FIG. 7, when the embedded electronic component 32 is accommodated within the cavity 30, a gap is provided between the inner wall of the cavity 30 and the embedded electronic component 32 in order to facilitate accommodation of the electronic component 32. However, the gap is filled in with resin of the insulating layer 34 when a thermal hardening process is performed on the insulating layer 34A of the buildup layer 34 so that a void may not be created at the cavity 30.

After the buildup layers 34 and 35 are formed, the solder resists 41 and 42 and the openings 43 and 44 are formed on the upper surface of the buildup layer 34 and the lower surface of the buildup layer 35, respectively. In this way, the electronic component embedded substrate 50 is formed as is shown in FIG. 9. In the method of fabricating the electronic component embedded substrate 50 according to the present embodiment, the thickness of the embedded electronic component 32 is not constrained to be less than or equal to the thickness of the buildup layer 17/23, and thereby, the cost of the electronic component embedded substrate 50 and the semiconductor device 60 implementing the electronic component embedded substrate 50 (see FIG. 10) may be reduced and their production yields may be improved.

Also, in the illustrated embodiment, the semi-additive method is used to form the buildup layers 17, 18, 23, 24, 34, and 35, and thereby, the wiring layers 17C, 18C, 23C, 24C, 34C, and 35C may be accurately formed on the buildup layers 17, 18, 23, 24, 34, and 35, respectively, and high densification of the electronic component embedded substrate 50 may be realized.

In the following, methods for fabricating the electronic component embedded substrate 50 according to second and third embodiments of the present invention are described.

FIGS. 11~18 are diagrams illustrating the fabrication method according to the second embodiment; and FIGS. 19~22 are diagrams illustrating the fabrication method according to the third embodiment. It is noted that in FIGS. 11~22, components that are identical to those shown in FIGS. 1~10 are given the same references and their descriptions are omitted. Also, it is noted that the fabrication methods according to the second and third embodiments are mainly characterized by a first buildup layer lamination process and a cavity formation process. Accordingly, emphasis is directed to describing the above two processes of the fabrication methods according to the second and third embodiments.

First, the method of fabricating the electronic component embedded substrate 50 according to the second embodiment is described with reference to FIGS. 11~18.

Figure 11:
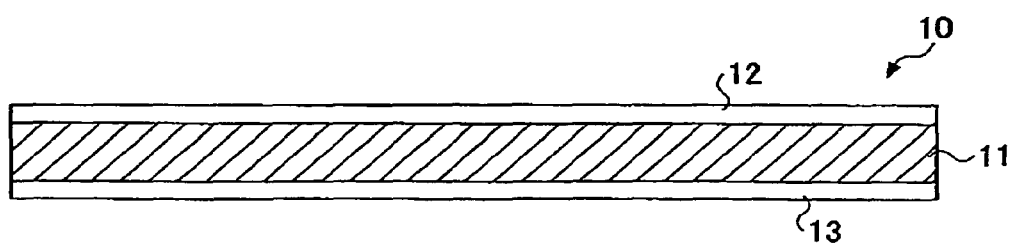
FIG. 11 is a diagram illustrating a first step of a method for fabricating an electronic component embedded substrate according to a second embodiment of the present invention.
Figure 12:
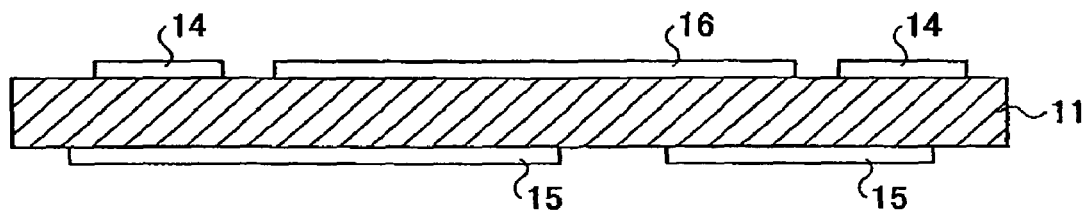
FIG. 12 is a diagram illustrating a second step of the fabrication method according to the second embodiment.
Figure 13:
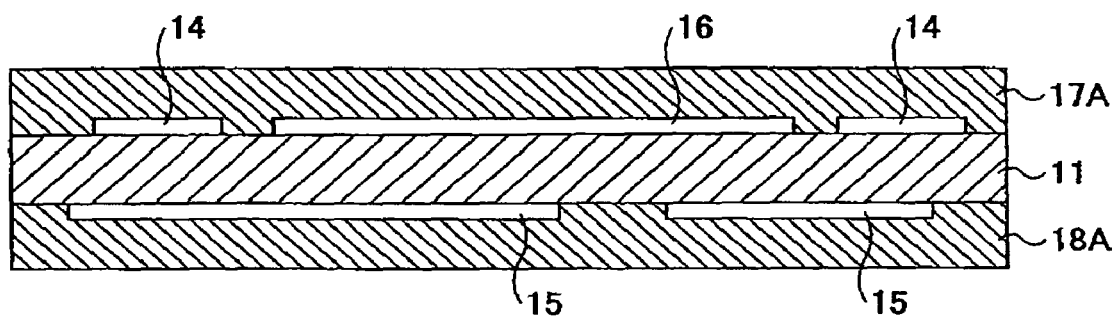
FIG. 13 is a diagram illustrating a third step of the fabrication method according to the second embodiment.

As is shown in FIG. 11, a copper clad laminate 10 is provided, and wirings 14, 15, and a stopper layer 16 are formed on a core substrate 11 in a manner similar to that described in relation to the first embodiment as is shown in FIG. 12. Then, insulating layers 17A and 18A are formed on the surfaces of the core substrate 11 having the wirings 14, 15 and the stopper layer 16 formed thereon as is shown in FIG. 13. It is noted that the process steps illustrated by FIGS. 11~13 are identical to those illustrated by FIGS. 1~3.

Figure 14:
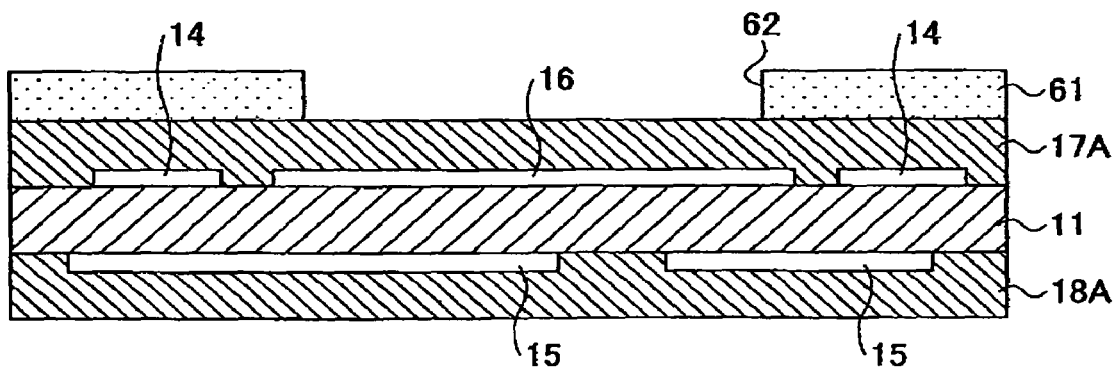
FIG. 14 is a diagram illustrating a fourth step of the fabrication method according to the second embodiment.

According to the present embodiment, a metal mask 61 is provided on the insulating layer 17A that is formed in the manner described above. The metal mask 61 may be made of copper or gold, for example, and includes an opening pattern 62 having a shape corresponding to the shape of a cavity 30 to be formed. FIG. 14 is a diagram showing a state in which the mask 61 is provided on the insulating layer 17A.

Then, an etching process is performed on the insulating layer 17A using the metal mask 61. For example, wet etching may be conducted using sodium permanganate.

Figure 15:
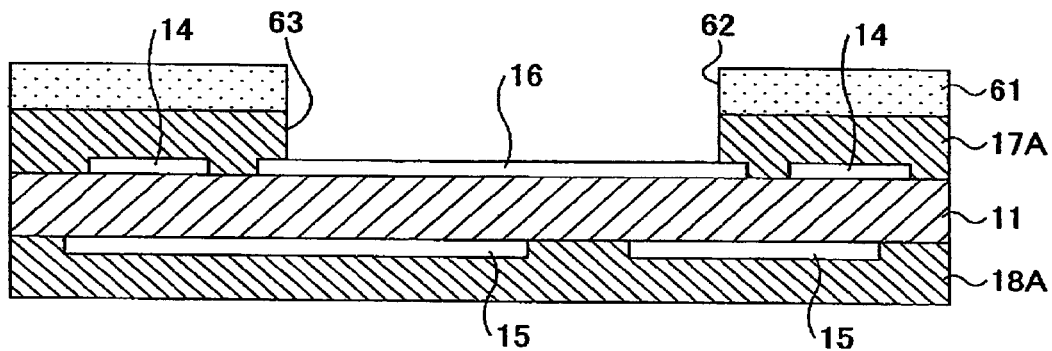
FIG. 15 is a diagram illustrating a fifth step of the fabrication method according to the second embodiment.

FIG. 15 is a diagram showing a state in which an opening 63 is formed at the insulating layer 17A through wet etching. This opening 63 forms a part of the cavity 30 as is described below.

In the present embodiment, the stopper layer 16 is provided at a portion of the surface of the core substrate 11 corresponding to the position at which the cavity 30 is to be formed, as in the first embodiment, and thereby, in the wet etching process for forming the opening 63, the wet etching is stopped when the insulating layer 17A is removed and the stopper layer 16 is exposed. In this way, the opening 63 of the insulating layer 17A may be accurately formed.

It is noted that in the present embodiment, the metal mask 61 is used as a mask for forming the opening 63; however, the opening 63 may be formed using other techniques as well. For example, instead of providing the metal mask 61, a resin mask may be formed using a dry film resist (DFR). However, in a case where wet etching is conducted using a resin mask, the resin mask may be degraded by the etching solution, and the opening 63 may not be accurately formed.

By conducting the wet etching process using the metal mask 61 as in the present embodiment, durability of the mask may be ensured. Thus, the metal mask 61 may be repeatedly used so that cost reduction may be realized with respect to a case of using a resin mask where the mask has to be removed each time.

Figure 16:
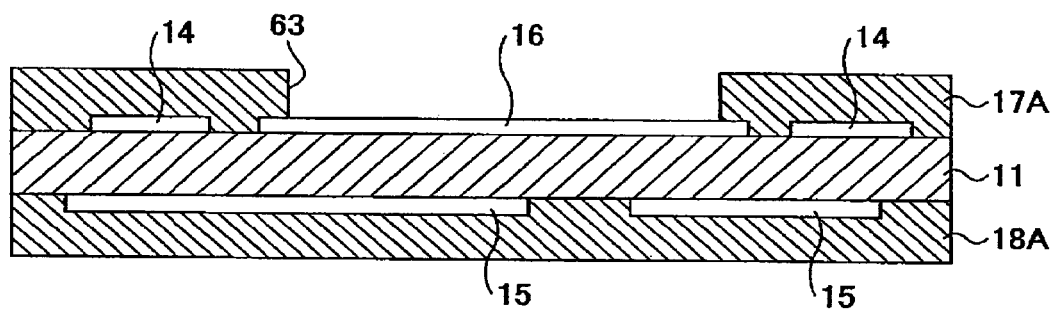
FIG. 16 is a diagram illustrating a sixth step of the fabrication method according to the second embodiment.
Figure 17:
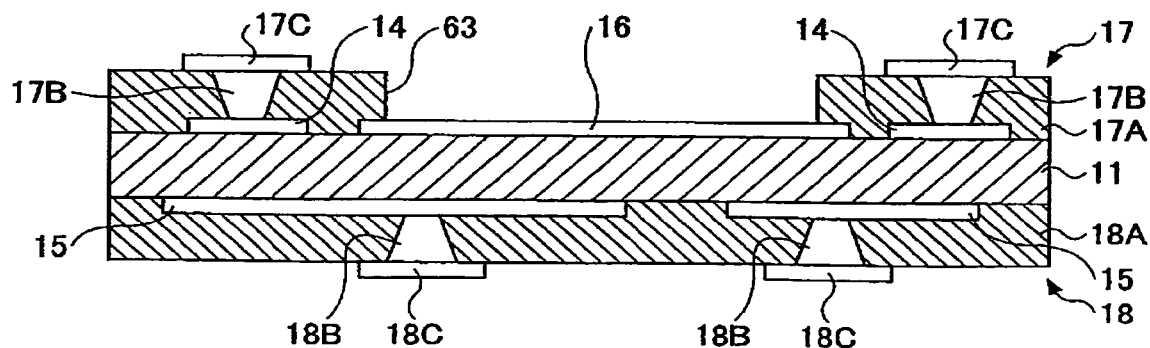
FIG. 17 is a diagram illustrating a seventh step of the fabrication method according to the second embodiment.
Figure 18:
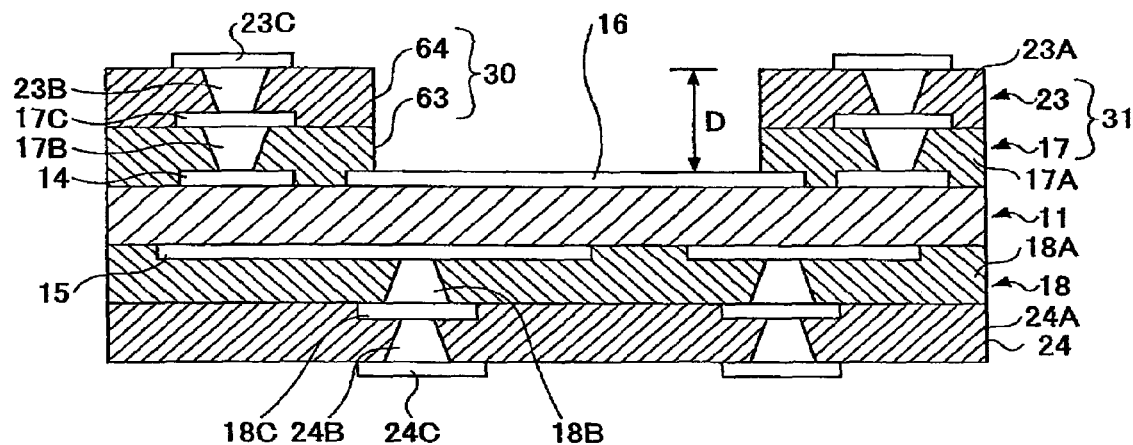
FIG. 18 is a diagram illustrating an eighth step of the fabrication method according to the second embodiment.

After the opening 63 is formed in the manner described above, the metal mask 61 is removed from the insulating layer 17A as is shown in FIG. 16, and vias 17B, 18B and wiring layers 17C, 18C are formed on the insulating films 17A and 18A. In this way, buildup layers 17 and 18 are formed on the surfaces of the core substrate 11. FIG. 17 is a diagram illustrating a state in which the buildup layers 17 and 18 are formed on the surfaces of the core substrate 11.

After the buildup layers 17 and 18 are formed, the processes illustrated by FIGS. 13~17 are repeated. Specifically, first, insulating layers 23A and 24A are laminated on the surfaces of the buildup layers 17 and 18, respectively. Then, the metal mask 61 is arranged on the insulating layer 23A, and wet etching is conducted on the insulating layer 23A to form an opening 64. The opening 64 forms the cavity 30 together with the opening 63 described above.

Then, the metal mask 61 is removed from the insulating layer 23A, and vias 23B, 24B and wiring layers 23C, 24C are formed on the insulating layers 23 and 24 using the buildup method. In this way, buildup layers 23 and 24 are laminated on the buildup layers 17 and 18, respectively.

It is noted that a second buildup layer lamination process of the fabrication method according to the present embodiment is identical to the process illustrated by FIGS. 7~9 of the first embodiment, and thereby, descriptions thereof are omitted.

According to the present embodiment, the cavity 30 is formed when plural buildup layers (e.g., the buildup layer 17 and the buildup layer 23) with openings formed thereon are laminated. In other words, the cavity 30 is formed when the first buildup layer laminated structure 31 is formed. It is noted that the depth D of the cavity 30 formed by laminating the buildup layers 17 and 23 is arranged such that the upper surface of the embedded electronic component 32 and the upper surface of the buildup layer 23 form a substantially common plane when the electronic component 32 is accommodated within the cavity 30 as in the first embodiment.

As can be appreciated from the above descriptions, according to the present embodiment, the cavity 30 is formed at the first buildup layer laminated structure 31 that is formed by laminating on the core substrate 11 plural buildup layers (e.g. buildup layers 17 and 23) having a total thickness corresponding to the thickness of the embedded electronic component 32, and the electronic component 32 is accommodated within this cavity 30. Therefore, the thickness of the embedded electronic component 32 is not constrained to be less than or equal to the thickness of the buildup layer 17/23, and the cost of the electronic component embedded substrate 50 may be reduced and its yield may be improved.

Also, according to the present embodiment, the openings 63 and 64 are individually formed in the respective formation processes of the buildup layers 17 and 23. That is, the openings 63 and 64 are formed by conducting wet etching on relatively thin buildup layers 17 and 23, each having a film thickness of approximately 50 μm, for example. Thereby, the openings 63 and 64 may be formed in a short period of time with high accuracy. In other words, by using the method of forming the cavity 30 according to the present embodiment, the cavity 30 may be formed in a short period of time with high accuracy compared to a case in which wet etching is conducted to form the cavity 30 after laminating the buildup layers 17 and 23.

In the following, the method of forming the electronic component embedded substrate 50 according to the third embodiment is described with reference to FIGS. 19~22.

Figure 19:
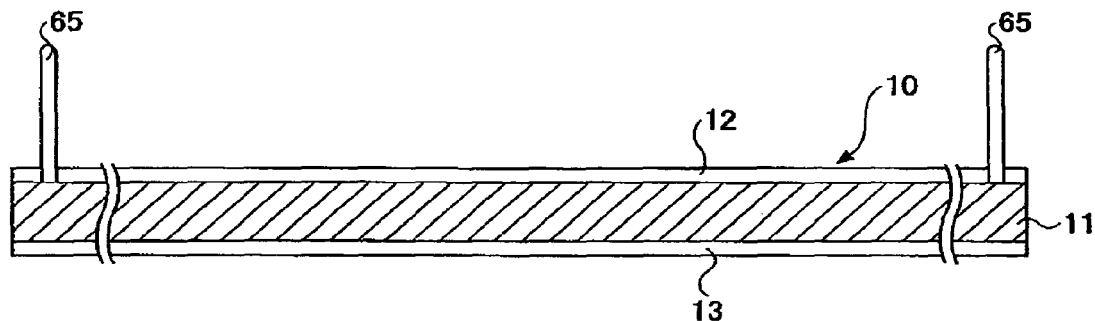
FIG. 19 is a diagram illustrating a first step of a method for fabricating an electronic component embedded substrate according to a third embodiment of the present invention.

According to the present embodiment, a copper clad laminate 10 is provided as is shown in FIG. 19. The copper clad laminate 10 used in the present embodiment includes positioning pins 65 that are provided at predetermined positions. In the illustrated embodiment, the positioning pins 65 are provided at the periphery of the formation position of the electronic component embedded substrate 50. It is noted that the height of the positioning pins 65 is arranged to be greater than the thickness of the embedded electronic component 32.

Figure 20:
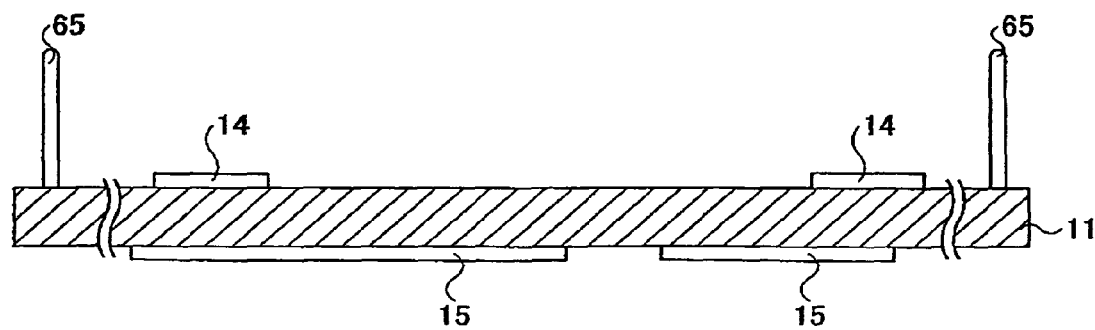
FIG. 20 is a diagram illustrating a second step of the fabrication method according to the third embodiment.

Then, patterning is conducted on copper films 12 and 13 of the copper clad laminate 10 in a manner similar to that described in relation to the first embodiment so that wirings 14 and 15 are formed as is shown in FIG. 20. It is noted that in the present embodiment, a stopper layer 16 is not formed.

Then, an insulating layer 17A is formed on the upper surface of the core substrate 11, and an insulating layer 18A is formed on the lower surface of the core substrate 11. It is noted that the insulating layer 17A has positioning holes 68 and an opening 70 formed beforehand. The positioning holes 68 are formed at positions corresponding to the positions of the positioning pins 65, and the opening 70 is formed at a position corresponding to the formation position of a cavity 30. The insulating layer 17A is mounted on the core substrate 11 by inserting the positioning pins 65 through the positioning holes 68.

Figure 21:
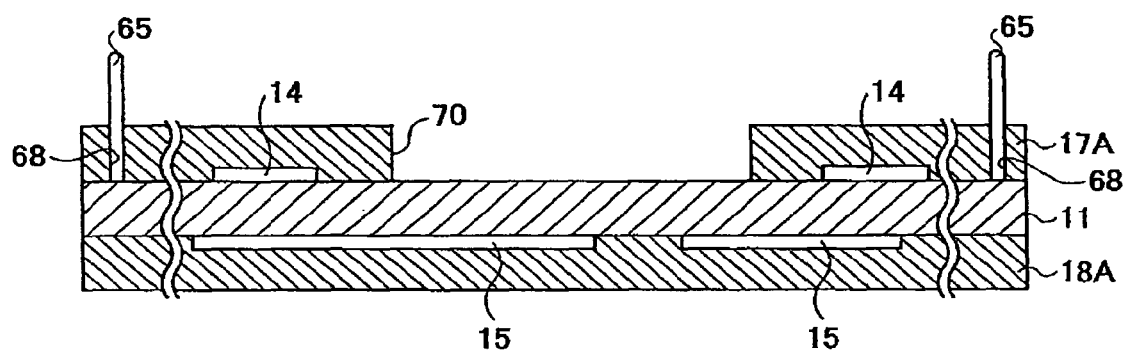
FIG. 21 is a diagram illustrating a third step of the fabrication method according to the third embodiment.

In other words, the insulating layer 17A is mounted on the core substrate 11 with the positioning holes 68 being positioned by the positioning pins 65. In this state, the opening 70 may be accurately positioned on the core substrate 11 at a position coinciding with the formation position of the cavity 30. FIG. 21 shows a state in which the insulating layers 17A and 18A are in place on the core substrate 11. It is noted that the insulating layer 18A is formed in a manner identical to that of the previously described embodiments.

Then, vias 17B, 18B, and wiring layers 17C, 18C are formed on the insulating layers 17A and 18A, respectively, using the buildup method. In this way, the buildup layers 17 and 18 are formed on the upper and lower surfaces of the core substrate 11.

After the buildup layers 17 and 18 are formed in the manner described above, buildup layers 23 and 24 are formed. It is noted that the buildup layers 23 and 24 may be formed using the formation methods identical to those used for forming the buildup layers 17 and 18. Specifically, an insulating layer 23A is laminated on the upper surface of the buildup layer 17, and an insulating layer 24A is laminated on the lower surface of the buildup layer 18.

As with the insulating layer 17A, the insulating layer 23A has positioning holes 69 and an opening 71 formed beforehand. The positioning holes 69 are formed at positions corresponding to the positions of the positioning pins 65, and the opening 71 is formed at a position corresponding to the formation position of the cavity 30. The insulating layer 23A is laminated on the buildup layer 17 by inserting the positioning pins 65 through the positioning holes 69.

In other words, the insulating layer 23A is laminated on the buildup layer with the positioning holes 69 being positioned by the positioning pins 65. In this state, the opening 71 may be accurately positioned to coincide with the position of the opening 70 of the buildup layer 17, and the cavity 30 may be formed. It is noted that the insulating layer 24A is laminated on the buildup layer 18 in a manner identical to that described in relation to the previous embodiments.

Figure 22:
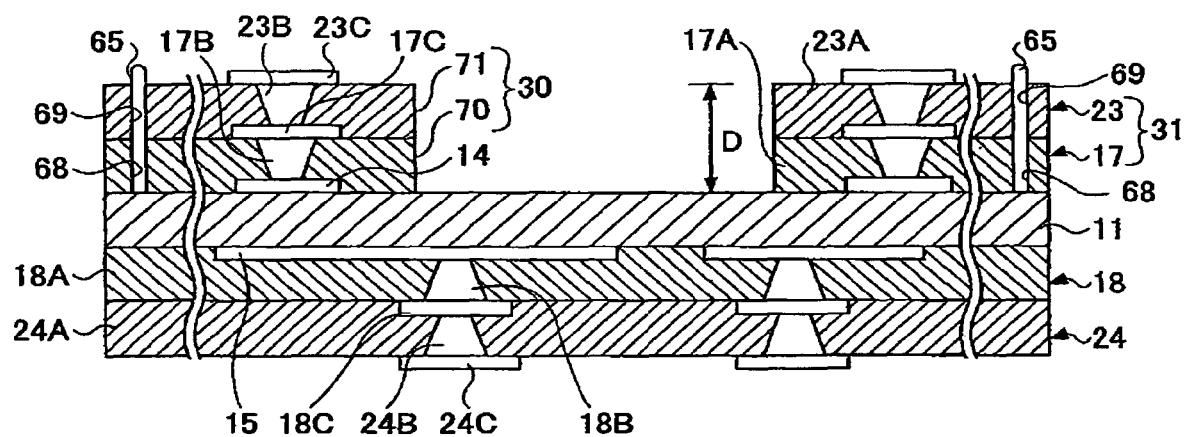
FIG. 22 is a diagram illustrating a fourth step of the fabrication method according to the third embodiment.

Then, vias 23B, 24B, and wiring layers 23C, 24C are formed on the insulating layers 23 and 24, respectively, using the buildup method. In this way, a first buildup layer laminated structure 31 including the buildup layers 17 and 23 is formed, and the buildup layer 24 is laminated on the buildup layer 18 as is shown in FIG. 22.

It is noted that an electronic component accommodating process and a second buildup layer lamination process that are performed after the above-described first buildup layer laminating process of the present embodiment are identical to the processes illustrated by FIGS. 7~9 of the first embodiment, and thereby their descriptions are omitted.

According to the present embodiment, the cavity 30 is formed when the buildup layers 17 and 23 respectively having openings 70 and 71 formed beforehand are laminated; that is, the cavity 30 is formed when the first buildup layer laminated structure 31 is formed. Also, as with the first and second embodiments, the depth D of the cavity 30 formed by laminating the buildup layers 17 and 23 is arranged such that the upper surface of the embedded electronic component 32 and the upper surface of the buildup layer 23 form a substantially common plane when the electronic component 32 is accommodated within the cavity 30.

As can be appreciated from the above descriptions, in the present embodiment, the cavity 30 is formed at the first buildup layer laminated structure 31 that is arranged to have a thickness corresponding to the thickness of the embedded electronic component 32 by laminating on the core substrate 11 plural buildup layers (e.g., buildup layers 17 and 23), and the embedded electronic component 32 is accommodated within the cavity 30. Therefore, the thickness of the embedded electronic component 32 is not constrained to be less than or equal to the thickness of the buildup layer 17/23. In turn, the cost of the electronic component embedded substrate 50 may be reduced and its yield may be improved as with the previous embodiments.

Also, according to the present embodiment, the positioning holes 68, 69, and the openings 70, 71 of the insulating layers 17A and 23A are formed beforehand in processes separate from the fabrication process for fabricating the electronic component embedded substrate 50, and thereby, the fabrication process for fabricating the electronic component embedded substrate 50 may be simplified. Further, the openings 70 and 71 may be positioned (to thereby form the cavity 30) by inserting the positioning pins 65 that are provided at the core substrate 11 through the positioning holes 68, 69, and thereby, the openings 70, 71 may be accurately positioned through simple procedures.

It is noted that in the embodiments described above, one electronic component embedded substrate 50 is fabricated from one copper clad laminate 10 (e.g., see FIG. 1); however the present invention is not limited to such embodiments and plural electronic component embedded substrates 50 may be formed on one copper clad laminate 10 (multi-piece fabrication process) to increase productivity, for example. In the case of applying the third embodiment to such a multi-piece fabrication process, the positioning pins 65 do not have to be provided for each of the formation regions of the electronic component embedded substrates 50. For example, a few (e.g., three) positioning pins 65 may be provided at the edges of the copper clad laminate 10, and in this way, the number of positioning pins 65 may be reduced and the copper clad laminate 10 may be efficiently used.

Further, it is noted that the present invention is not limited to the specific embodiments described above, and variations and modifications may be made without departing from the scope of the present invention.

The present application is based on and claims the benefit of the earlier filing date of Japanese Patent Application No. 2004-194783 filed on Jun. 30, 2004, the entire contents of which are hereby incorporated by reference.

What is claimed is:

1. A method of fabricating an electronic component embedded substrate including an electronic component that is embedded within a plurality of buildup layers, each buildup layer comprising an insulation layer and a wiring layer, the method comprising:

a stopper layer forming step of forming a stopper layer on a core substrate at a position corresponding to a formation position of a cavity;

a first buildup layer lamination step of laminating a plurality of first buildup layers on the core substrate such that a total thickness of the laminated first buildup layers corresponds to a thickness of the electronic component;

a cavity formation step of forming the cavity through the laminated first buildup layers by laser processing, said cavity having a depth corresponding to the thickness of the electronic component, wherein the laser processing has a greater processing speed for the first buildup layers than a processing speed for the stopper layer;

an accommodating step of accommodating the electronic component within the cavity; and a second buildup layer lamination step of laminating one or more second build up layers on the laminated first buildup layers and the electronic component.

2. The method as claimed in claim 1, wherein a semi-additive method is used in the first buildup layer lamination step and the second buildup layer lamination step.

3. A method of fabricating an electronic component embedded substrate including an electronic component that is embedded within a plurality of buildup layers, each comprising an insulation layer and a wiring layer, the method comprising:

a first buildup layer lamination step of laminating a plurality of first buildup layers on a core substrate such that a total thickness of the laminated first buildup layers corresponds to a thickness of the electronic component, the first buildup layers having openings formed beforehand at positions corresponding to a formation position of a cavity for accommodating the electronic component, said cavity having a depth corresponding to a thickness of the electronic component, wherein positioning pins are inserted in the core substrate through corresponding positioning holes included in the first buildup layers so that the openings of the first buildup layers are arranged to coincide with each other to form the cavity;

an accommodating step of accommodating the electronic component within the cavity; and a second buildup layer lamination step of laminating one or more second build up layers on the laminated first buildup layers and the electronic component.

* * * * *